United States Patent
Hsieh

(10) Patent No.: US 6,666,640 B1
(45) Date of Patent: Dec. 23, 2003

(54) FASTENER FOR A HEAT-RADIATOR ON A CHIP

(76) Inventor: Hsin-Mao Hsieh, No. 6, East Section, Chiao Nan Li, Industrial 6th Rd., Pingtung City, Pingtung Hsien (TW)

( * ) Notice: Subject to any disclaimer, the term of this patent is extended or adjusted under 35 U.S.C. 154(b) by 0 days.

(21) Appl. No.: 10/190,697

(22) Filed: Jul. 9, 2002

(51) Int. Cl.[7] ............... F16B 13/00; F16B 19/00
(52) U.S. Cl. .............. 411/508; 411/544; 411/552; 411/913; 165/80.3; 24/453
(58) Field of Search ................... 411/343, 508, 411/509, 510, 544, 552, 913; 165/80.3; 361/704; 24/453

(56) References Cited

U.S. PATENT DOCUMENTS 6,301,113 B1 * 10/2001 Guerrero ................. 361/704
6,334,750 B1 * 1/2002 Hsieh ...................... 411/508
6,496,372 B1 * 12/2002 Davison et al. ......... 411/508 X
6,526,634 B1 * 3/2003 Hsieh ..................... 411/508 X

* cited by examiner

Primary Examiner—Neill Wilson
(74) Attorney, Agent, or Firm—Dennison, Schultz & Dougherty

(57) ABSTRACT

A fastener for a heat-radiator on a chip has a leg with a lower end and an upper end. A cone-shaped foot of which a maximum diameter is larger than that of the leg is formed at the lower end of the leg. A head is formed at an upper end of the leg. Two flexible bow arms are oppositely formed at two sides of the leg, each with a first end fixed on a bottom face of the head. A ring is formed on second ends of the bow arms. An opening is defined in the ring for the leg extending therethrough. A resilient member is provided outside the leg and extends through the opening.

2 Claims, 8 Drawing Sheets

FASTENER FOR A HEAT-RADIATOR ON A CHIP

BACKGROUND OF THE INVENTION

1. Field of the Invention

The present invention is related to a fastener, and more particularly to a fastener with a resilient member for installing a radiator on a chip in a computer.

2. Description of Related Art

Referring to FIGS. 7 and 8, a conventional fastener (5), by which a radiator (20) to lower the temperature of an operating chip (30) is installed on a main board (40), has a leg (50). A cone-shaped foot (51) of which a maximum diameter is larger that of the leg (50) is formed at a bottom end of the leg (50). A channel (52) is defined at a joint of the leg (50) and the foot (51). The channel (52) enables the foot (51) to be compressed, whereafter the foot (51) is narrow enough to be inserted through apertures (41) in the main board (40). A neck (53) is formed at a top end of the leg (50) and a head (54) is formed at a distal end of the neck (53). Two bow arms (55) are oppositely provided at two sides of the neck (53) and each has a fixed end adjacent the head (54) and a free end adjacent the leg (50).

The heat-radiator (20) has a plurality of first apertures (21) respectively aligned with a plurality of the second apertures (41) defined in the main board (40). When a user uses the fastener (5) to assemble the heat-radiator (20) on the main board (40), the foot (51) is compressed to pass through one of the first apertures (21) and the respective second aperture (41), and afterwards recovers to its original size whereby the fastener (5) is secured below/above the apertures (21, 41). At the same time, the bow arms (55) are compressed to push against a top surface of the heat-radiator (20). Thus, the heat-radiator (20) is fastened on the main board (40).

However, the fastening effect of the conventional fastener is not satisfactory because the bow arms (55) each have only a small contact area with the top surface of the heat-radiator (20) and the fastener (5) does not effectively fasten. Furthermore, a heat radiator fitted with a cooling fan may suffer from vibrations coming from the fan during operation.

Another fastener (1') for overcoming the disadvantages in the above one is illustrated in FIGS. 5 and 6. The fastener (1') has a leg (10'). A cone-shaped foot (11') of which a maximum diameter is larger than that of the leg (10') is formed at a lower end of the leg (10'). A channel (12') is transversally defined through a joint of the leg (10') and the foot (11'). A head (13') is formed at an upper end of the leg (10'). Two bow arms (14') are oppositely formed at two sides of the leg (10') each with a first end fixed on a bottom face of the head. A ring (15') is formed on second ends of the bow arms (14') with an opening (16') for the leg (10') to extend therethrough.

When the heat-radiator (20) is installed on the main board (40) by the fasteners (1'), the foot (11') and the lower end of the leg (10') are compressed to become small enough to pass through the apertures (21, 41), and then they recover to their original sizes whereby the fastener (1') will not be unintentionally released from the apertures (21, 41). At the same time, the ring (15') is pushed by the heat-radiator (20) towards the head (13') to compress the bow arms (14') whereby resiliency of the bow arms (14') urges the ring (15') back against a top surface of the heat-radiator (20), as well as pulling up the foot (1') against the bottom face of the main board. Because a bottom face of the ring (15') fully contacts the heat-radiator (20) and there is a large contact area, the heat-radiator (20) is tightly mounted on the main board (40) by the fastener (1) without any possibility of loosening. Furthermore, the large contact area can help to eliminate vibrations of a cooling fan installed on the main board (40) during operation.

However, the fastener (1') generally made up of a plastic material will be softened under a high temperature caused by the chip (30) during operating, and the resiliency to fasten the heat-radiator (20) is weakened.

Therefore, the invention provides an improved fastener for a heat-radiator to mitigate and/or obviate the aforementioned problems.

SUMMARY OF THE INVENTION

The main objective of the invention is to provide a fastener that has a resilient member provided thereon for installing a heat-radiator on a main board further securely.

Other objects, advantages and novel features of the invention will become more apparent from the following detailed description when taken in conjunction with the accompanying drawings.

DESCRIPTION OF THE PREFERRED EMBODIMENT

Figure 1:
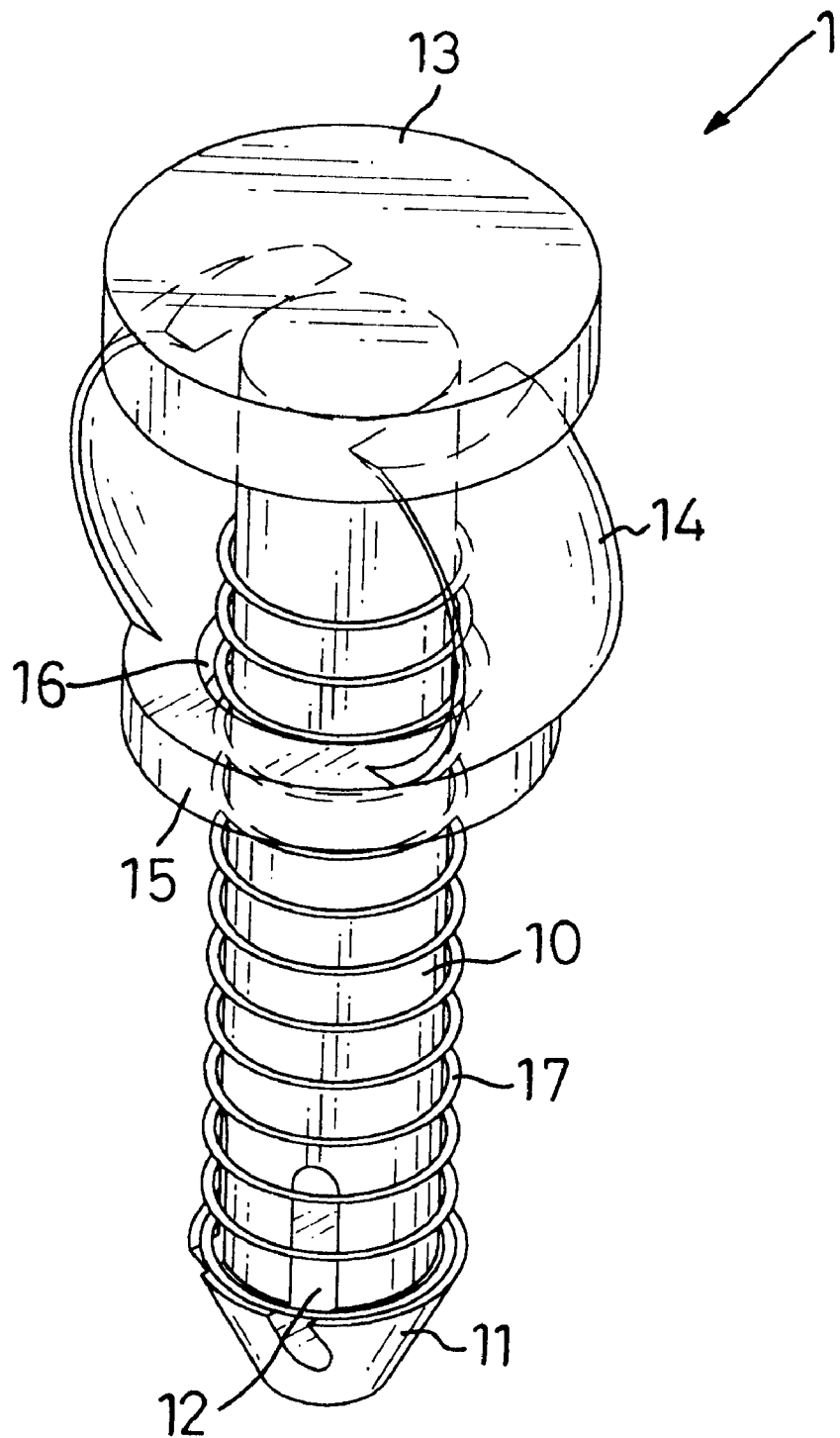
FIG. 1 is a perspective view of a fastener for a heat-radiator in accordance with the invention.

Referring to FIG. 1, a fastener (1) in accordance with the invention has a leg (10). The leg (10) includes a lower end and an upper end. A cone-shaped foot (11) of which a maximum diameter is larger than that of the leg (10) is formed at the lower end of the leg (10). At least two channels (12) are transversally defined through a joint of the leg (10) and the foot (12), and enable the foot (11) and the lower end of the leg (10) to be deformed to a smaller size than normal. A resilient member (17) is provided outside the leg (10) and abuts the cone-shaped foot (11).

A head (13) is formed at the upper end of the leg (10). Two bow arms (14) are oppositely formed on two sides of the leg (10) each with a first end fixed on a bottom face of the head (13). A ring (15) is formed on second ends of said bow arms (14). An opening (16) is defined in the ring (15) for the leg (10) extending therethrough.

An outer diameter of the resilient member (17) is larger than a diameter of the leg (10) but smaller than a diameter of the opening (16), so that the resilient member (17) can be moved along the leg (10) and through the opening (16).

Figure 2:
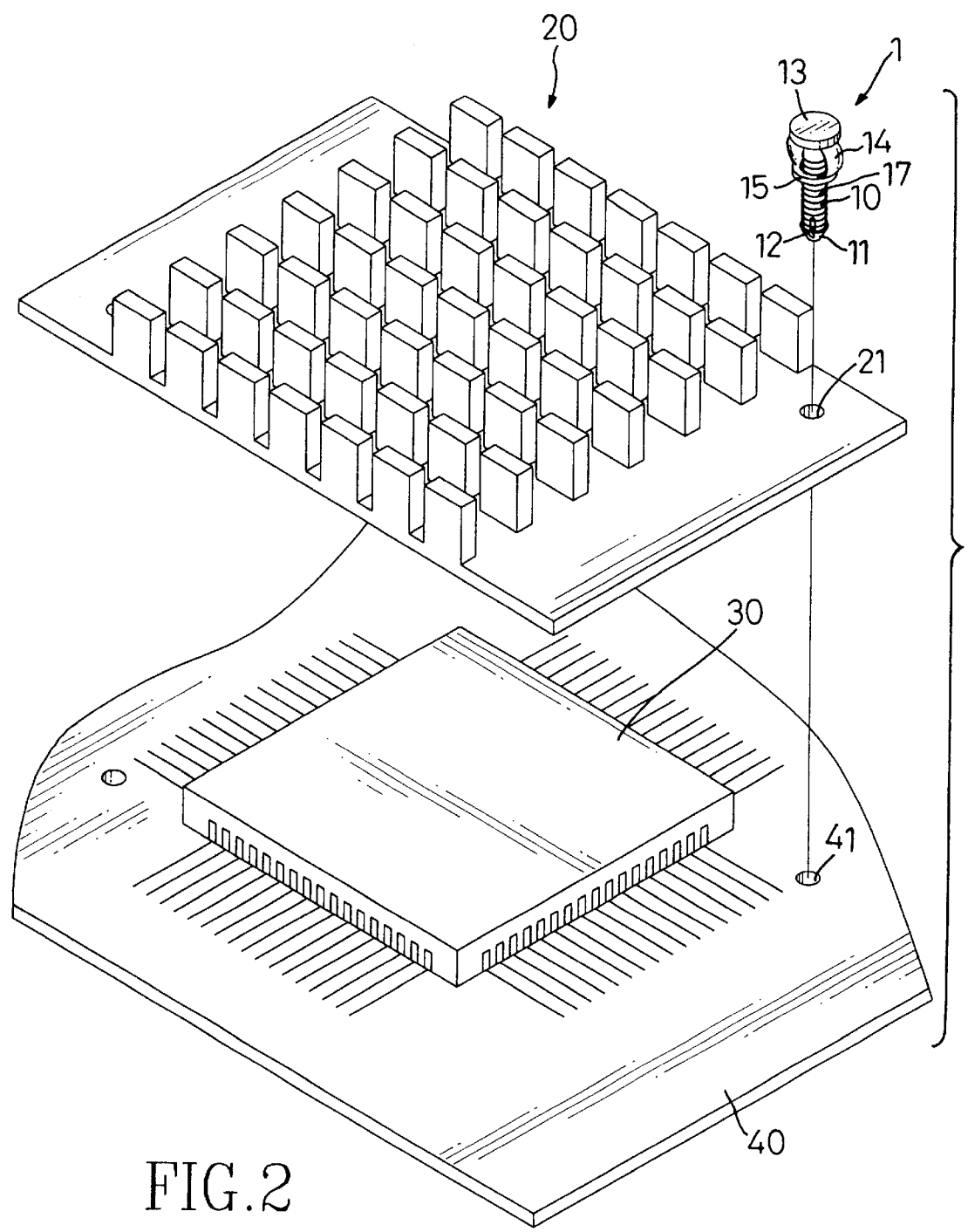
FIG. 2 is a perspective view showing the fastener to fasten the heat-radiator on a chip.
Figure 3:
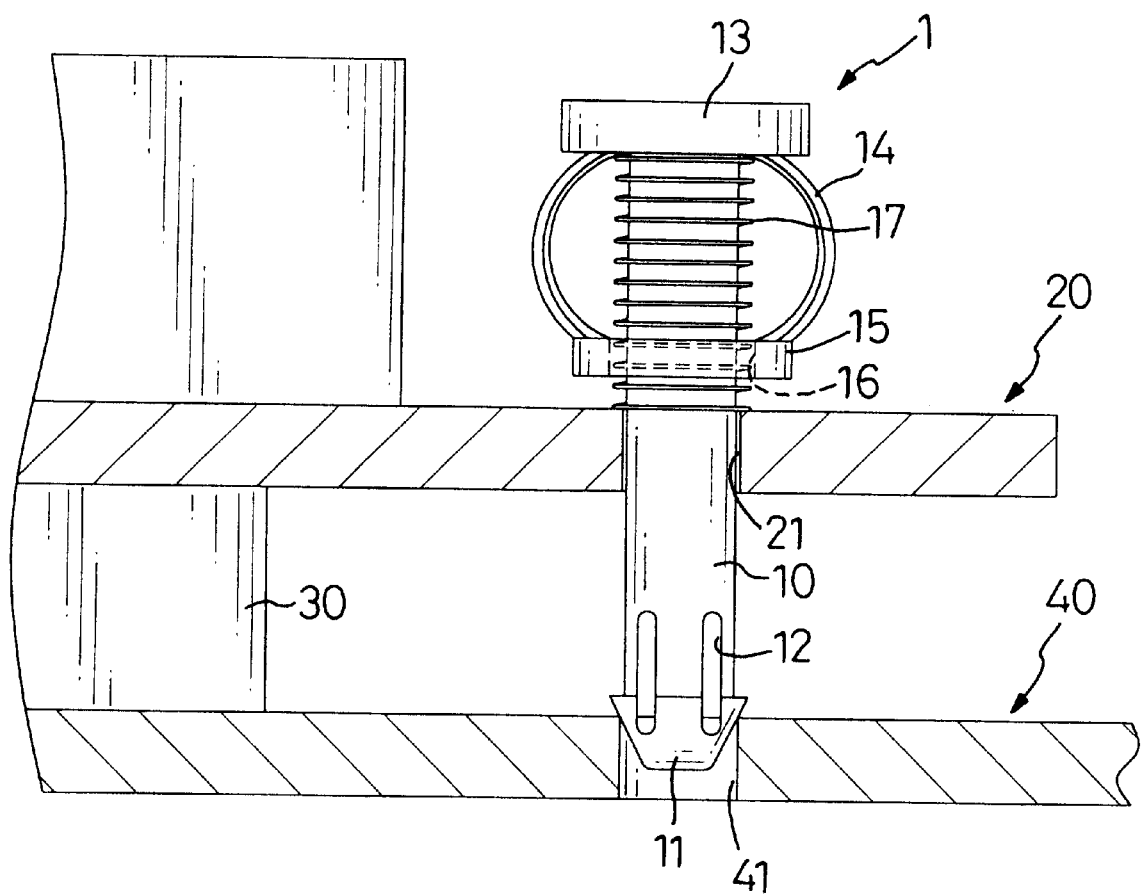
FIG. 3 is a side sectional view showing the fastener being inserted in the heat-radiator and a main board.

Referring to FIGS. 2 and 3, a heat-radiator (20) is mounted on a chip (30) installed on a main board (40), and first apertures (21) of the heat-radiator (20) are aligned with second apertures (41) of the main board (40). Although in practice each matched pair of first and second apertures (21, 41) receives therethrough a corresponding one of the fasteners (1), reference hereinafter is in the singular.

Figure 4:
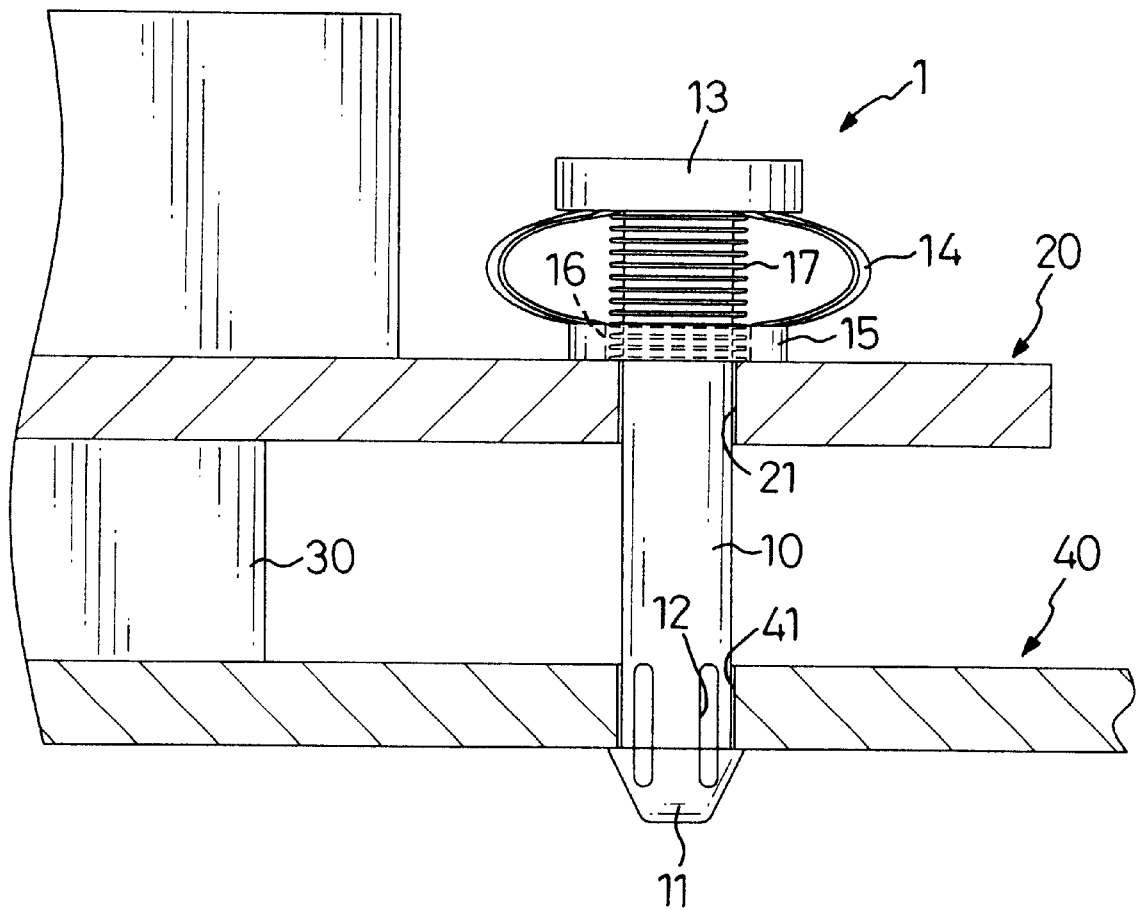
FIG. 4 is a side sectional view showing the fastener having been inserted in the heat-radiator and a main board.
Figure 5:
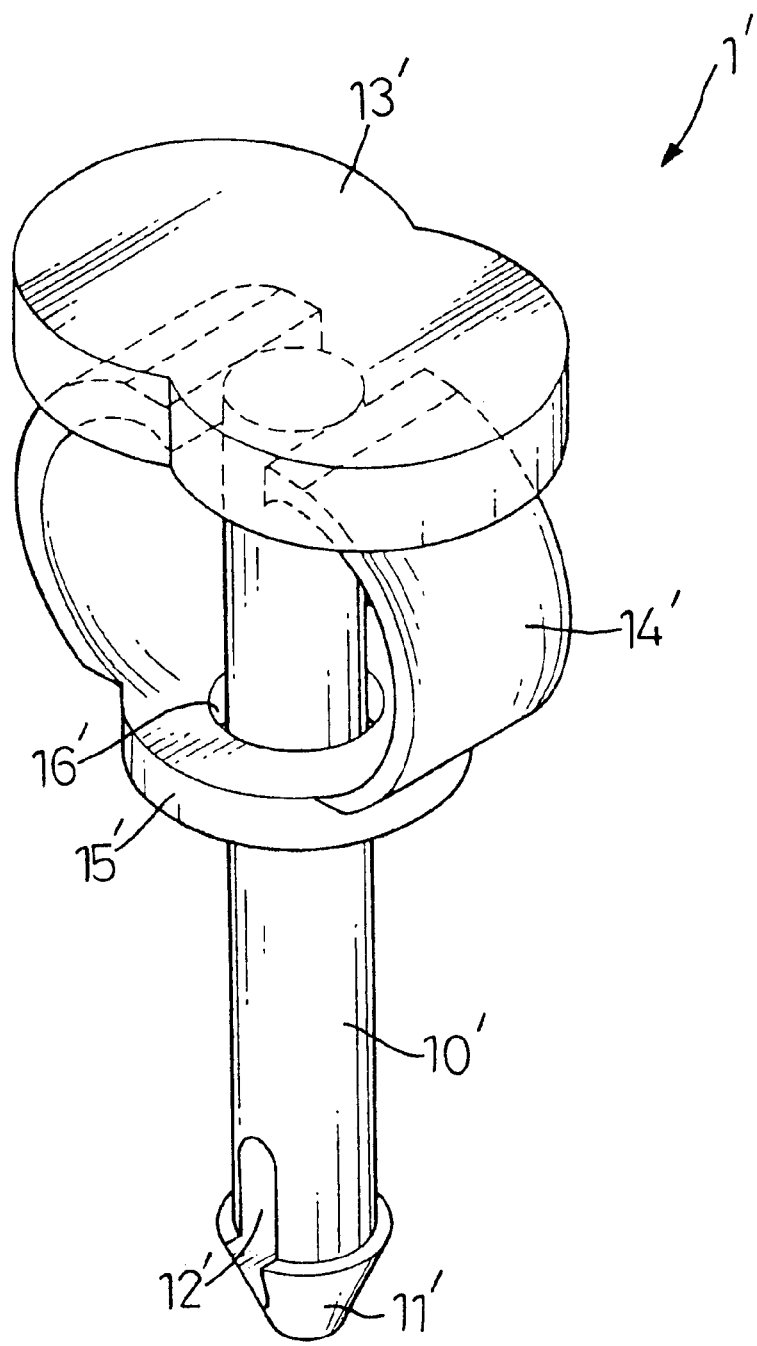
FIG. 5 is a perspective view of a conventional fastener.
Figure 6:
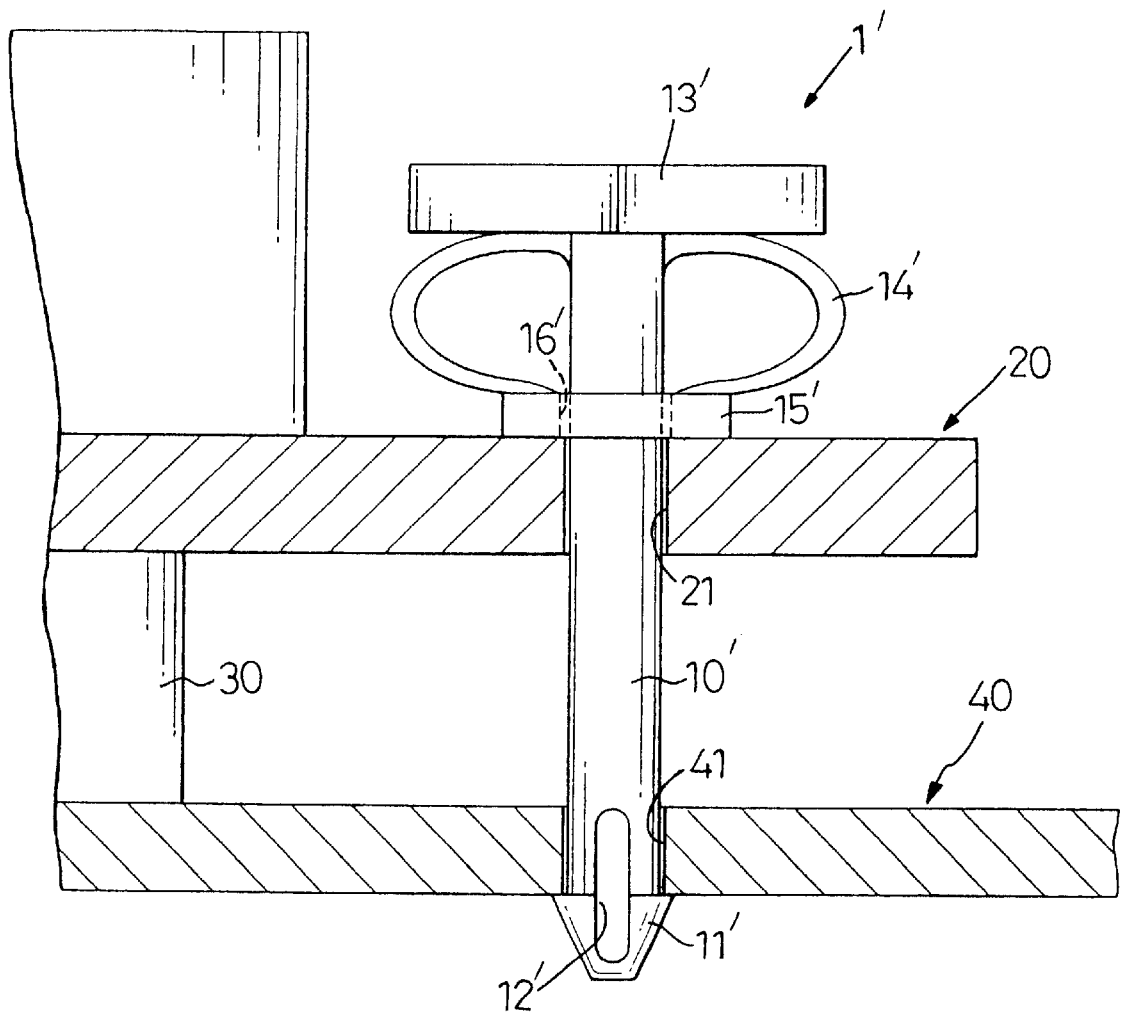
FIG. 6 is a side sectional view showing the conventional fastener in FIG. 5 fastening the heat-radiator on a main board.
Figure 7:
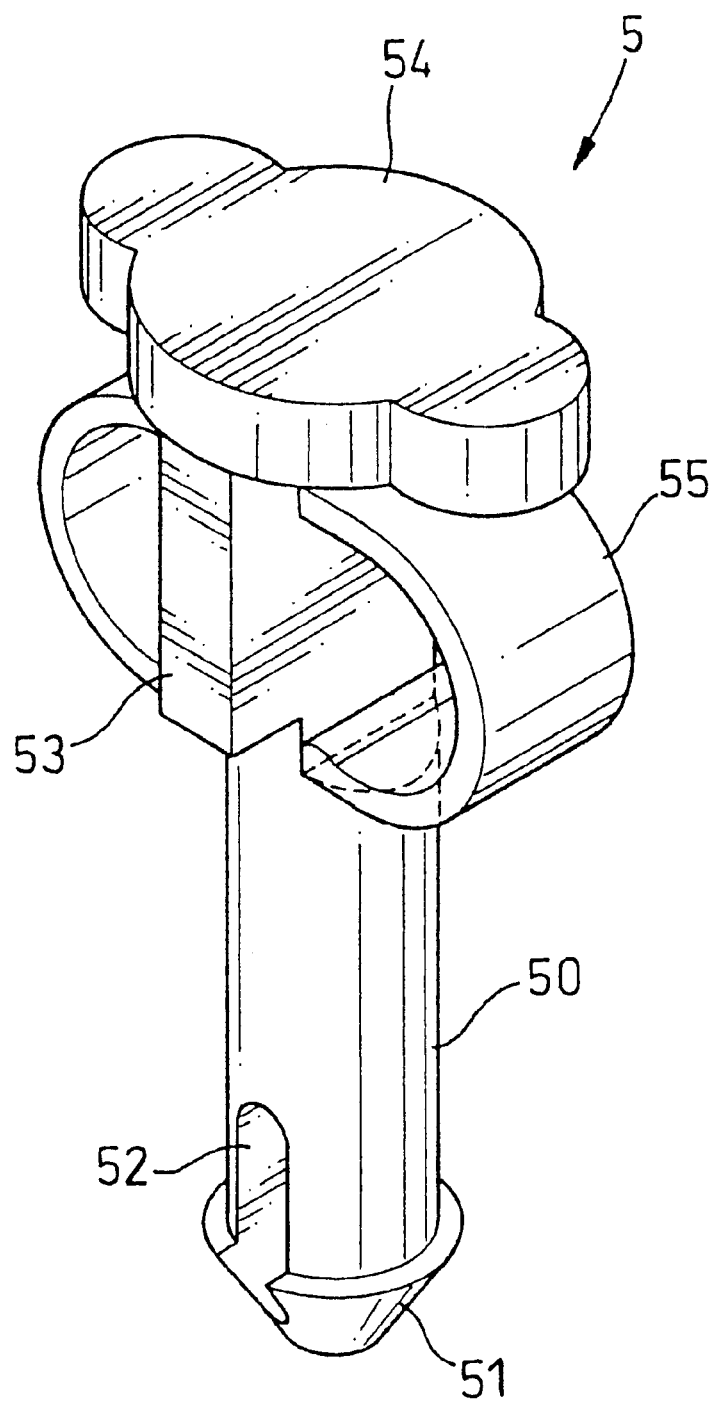
FIG. 7 is a perspective view of another conventional fastener.
Figure 8:
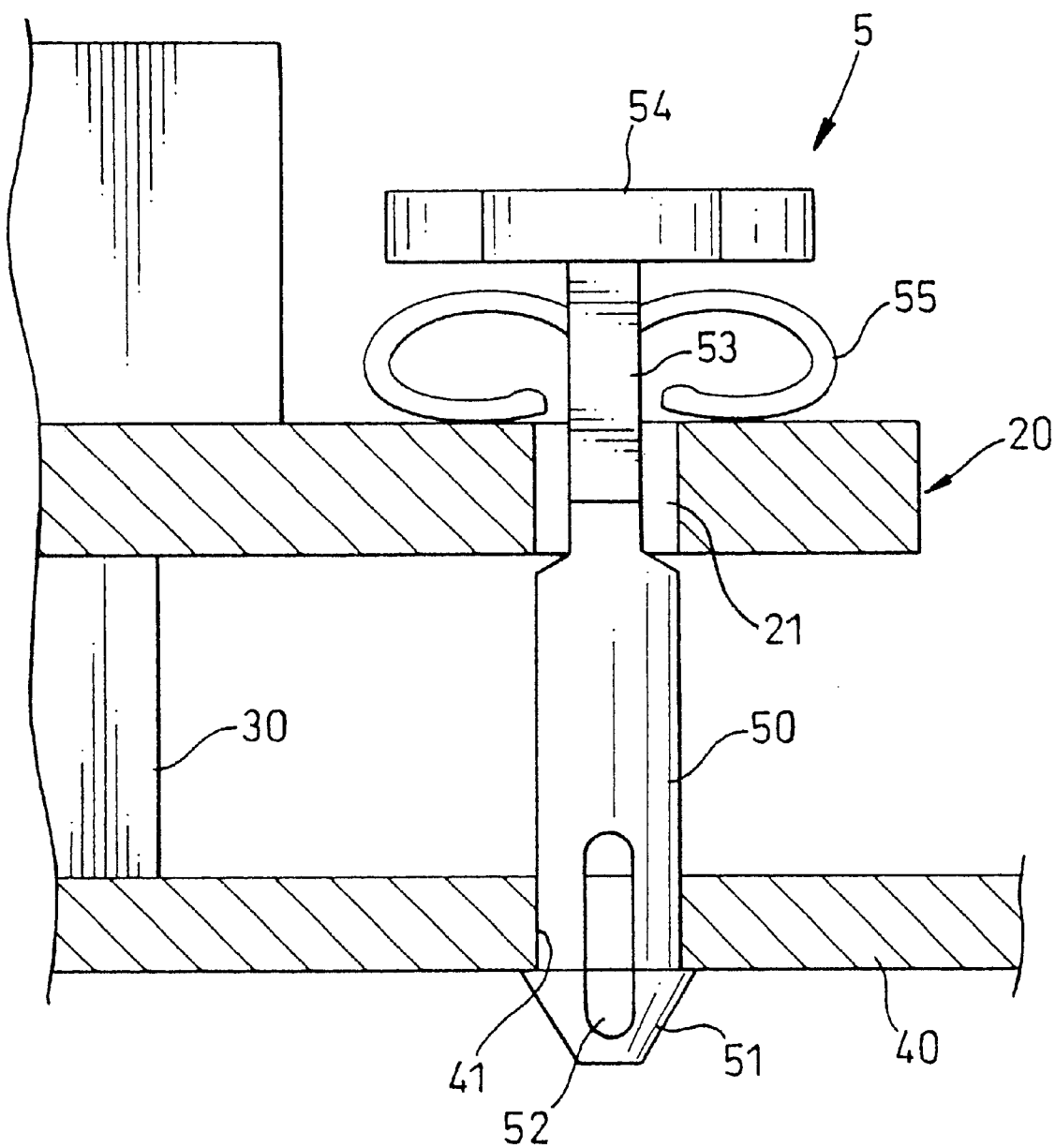
FIG. 8 is a side sectional view showing the conventional fastener in FIG. 7 fastening the heat-radiator on a main board.

Referring to FIGS. 3 and 4, to engage the heat radiator (20) with the main board (40) and sandwich the chip (30) therebetween, the foot (11) and the lower end of the leg (10) are compressed to become small enough to pass through the apertures (21, 41), and then they recover to their original sizes whereby the fastener (1) will not be unintentionally released from the apertures (21, 41). At the same time, the ring (15) is pushed by the heat-radiator (20) towards the head (13) to compress the bow arms (14) whereby resiliency of the bow arms (14) urges the ring (15) back against a top surface of the heat-radiator (20), as well as pulling up the foot (11) against the bottom face of the main board. Blocked by the heat-radiator (20) and compressed between the head (13) and the heat-radiator (20), the resilient member (17) gives a further force to push the head (13) and pull up the foot (11), so that the heat-radiator (30) is securely mounted on the chip (30).

According to the present invention, if the bow arms (14) fail through softening at high temperature, under the force of the resilient member (17), the heat-radiator (20) can be still tightly mounted on the chip (30) without any possibility of loosening.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for a heat-radiator on a chip, the fastener comprising:

a leg (10) with a lower end and an upper end;

a cone-shaped foot (11) of which a maximum diameter is larger than that of said leg formed at the lower end of said leg (10);

a head (13) formed at an upper end of said leg (16);

two flexible bow arms (14) oppositely formed at two sides of said leg (10) each with a first end fixed on a bottom face of said head (14);

a ring (15) formed on second ends of said bow arms (14);

an opening (16) defined in the ring (15) for said leg (10) extending therethrough; and a resilient member (17) provided outside said leg (10) and extending through the opening (16).

2. The fastener as claimed in claim 1 further comprising at least two channels (12) transversally defined through a joint of said leg (10) and said cone-shaped foot (11).

* * * * *